US 008618496B2

(12) United States Patent
Wieland et al.

(10) Patent No.: US 8,618,496 B2
(45) Date of Patent: Dec. 31, 2013

(54) CHARGED PARTICLE SYSTEM COMPRISING A MANIPULATOR DEVICE FOR MANIPULATION OF ONE OR MORE CHARGED PARTICLE BEAMS

(75) Inventors: Marco Jan-Jaco Wieland, Delft (NL); Stijn Willem Herman Karel Steenbrink, The Hague (NL); Alexander Hendrik Vincent van Veen, Rotterdam (NL); Alrik van den Brom, Utrecht (NL)

(73) Assignee: Mapper Lithography IP B.V., Delft (NL)

( * ) Notice: Subject to any disclaimer, the term of this patent is extended or adjusted under 35 U.S.C. 154(b) by 0 days.

(21) Appl. No.: 13/458,861

(22) Filed: Apr. 27, 2012

(65) Prior Publication Data

US 2012/0273690 A1 Nov. 1, 2012

Related U.S. Application Data

(60) Provisional application No. 61/479,475, filed on Apr. 27, 2011, provisional application No. 61/547,217, filed on Oct. 14, 2011.

(30) Foreign Application Priority Data

Oct. 14, 2011 (NL) ..................................... 2007604

(51) Int. Cl.
*G03B 27/54* (2006.01)
*H01J 3/14* (2006.01)
(52) U.S. Cl.
USPC ............... 250/396 ML; 250/394; 250/396 R; 250/397; 250/492.2; 250/492.22; 355/30; 355/67; 355/72

(58) Field of Classification Search
USPC ........... 250/394, 396 ML, 396 R, 397, 492.2, 250/492.22; 355/30, 67, 72
See application file for complete search history.

(56) References Cited

U.S. PATENT DOCUMENTS

| 6,483,120 | B1 * | 11/2002 | Yui et al. ..................... 250/491.1 |
| 6,563,124 | B2 * | 5/2003 | Veneklasen et al. ........ 250/492.2 |
| 6,703,629 | B2 * | 3/2004 | Nakasugi ................... 250/492.22 |
| 6,897,458 | B2 * | 5/2005 | Wieland et al. ............. 250/494.1 |
| 7,091,504 | B2 * | 8/2006 | Wieland et al. ............. 250/494.1 |
| 7,244,949 | B2 * | 7/2007 | Knippelmeyer et al. ..... 250/396 ML |
| 7,358,512 | B1 * | 4/2008 | Lordi ......................... 250/492.24 |
| 7,868,300 | B2 * | 1/2011 | Kruit et al. .................... 250/397 |
| 8,089,056 | B2 * | 1/2012 | Wieland et al. ............. 250/492.2 |
| 8,110,813 | B2 * | 2/2012 | Baars et al. ............... 250/396 R |
| 8,134,135 | B2 * | 3/2012 | Kruit et al. ............... 250/492.22 |
| 8,198,602 | B2 * | 6/2012 | Steenbrink et al. ........ 250/396 R |
| 8,258,484 | B2 * | 9/2012 | Wieland et al. ............ 250/396 R |
| 2006/0114445 | A1 * | 6/2006 | Ebihara ........................... 355/72 |

(Continued)

*Primary Examiner* — David A Vanore
(74) *Attorney, Agent, or Firm* — Blakely Sokoloff Taylor & Zafman

(57) ABSTRACT

A charged particle system such as a multi beam lithography system. A manipulator device manipulates one or more charged particle beams. The manipulator device includes at least one through opening in the plane of the planar substrate for passing at least one charged particle. Each through opening is provided with electrodes arranged in a first set of multiple first electrodes along a first part of a perimeter of the through opening and in a second set of multiple second electrodes along a second part of the perimeter. An electronic control circuit is arranged for providing voltage differences the electrodes in dependence of a position of the first and second electrode along the perimeter of the through opening.

36 Claims, 10 Drawing Sheets

(56) References Cited

U.S. PATENT DOCUMENTS

| | | | |
|---|---|---|---|
| 2007/0064214 A1* | 3/2007 | Ebihara | 355/72 |
| 2009/0212229 A1* | 8/2009 | Wieland et al. | 250/396 R |
| 2011/0216299 A1* | 9/2011 | Steenbrink et al. | 355/67 |
| 2011/0272576 A1* | 11/2011 | Otaki et al. | 250/306 |
| 2012/0091318 A1* | 4/2012 | Wieland et al. | 250/208.2 |
| 2012/0091358 A1* | 4/2012 | Wieland et al. | 250/396 R |
| 2012/0145916 A1* | 6/2012 | Wieland et al. | 250/396 R |
| 2012/0211677 A1* | 8/2012 | Kruit et al. | 250/492.23 |
| 2012/0241641 A1* | 9/2012 | Sano et al. | 250/396 R |
| 2012/0273690 A1* | 11/2012 | Wieland et al. | 250/396 R |
| 2012/0273691 A1* | 11/2012 | van den Brom et al. | 250/396 R |
| 2012/0286168 A1* | 11/2012 | Derks et al. | 250/396 R |
| 2012/0286169 A1* | 11/2012 | Van De Peut et al. | 250/396 R |
| 2012/0292491 A1* | 11/2012 | Wieland et al. | 250/215 |
| 2012/0292524 A1* | 11/2012 | Wieland et al. | 250/398 |
| 2012/0293780 A1* | 11/2012 | Dinu-Gurtler et al. | 355/30 |
| 2012/0295202 A1* | 11/2012 | Sano | 430/296 |
| 2012/0295203 A1* | 11/2012 | Sano | 430/296 |
| 2013/0032729 A1* | 2/2013 | Knippelmeyer | 250/394 |

* cited by examiner

CHARGED PARTICLE SYSTEM COMPRISING A MANIPULATOR DEVICE FOR MANIPULATION OF ONE OR MORE CHARGED PARTICLE BEAMS

This is a non-provisional application claiming the benefit of U.S. Provisional Application No. 61/479,475, filed Apr. 27, 2011, and U.S. Provisional Application No. 61/547,217, filed Oct. 14, 2011.

BACKGROUND

The invention relates to a charged particle system, such as a multi beam lithography system, comprising a manipulator device for manipulation of one or more charged particle beams.

Charged particle systems, such as (multi) electron beam systems, are being developed for high throughput maskless lithography systems, (multi) electron beam microscopy and (multi) electron beam induced deposition devices. In particular for maskless lithography systems, individual beam modulation or manipulation is needed during the writing of a pattern on a substrate.

Those lithography systems comprise either continuous sources or sources operating at constant frequency or at a varying frequency. Pattern data can be sent towards a manipulator device (or modulation means), which may be able to completely or partly stop the emitted beams from reaching the target exposure surface when necessary. The manipulator device (or modulation means) can also be provided for changing other characteristics of the emitted beam, such as a position, a cross-section, an intensity, a direction and/or an opening angle of the beam.

Preferably, the maskless lithography system comprises one source which can emit a diverging beam of charged particles, which charged particle beam is directed to an aperture array. The aperture array splits the charged particle beam into a plurality of charged particle beams or beamlets. This method of producing a plurality of charged particles has the advantage that it yields a large number of closely spaced beams or beamlets.

However, any manipulator device for such closely spaced plurality of charged particle beamlets requires closely spaced arrays of manipulators. Such closely spaced arrays are difficult to produce. In particular electrical circuits for controlling many manipulators are difficult to arrange in the lithography system. In addition, cross-talk between manipulators and other circuits in the vicinity of the manipulators can cause errors in the manipulation of the beams.

Furthermore, it can be difficult to produce a manipulator device that is able to manipulate the charged particle beam with sufficient accuracy. The manipulation by a manipulation device can depends on the exact location of the projection of the beam on the manipulation device. Any misalignment of the charged particle beam will then result in large manipulation errors.

It is an object of the present invention to provide a solution, at least in part, for at least one of the above identified problems.

SUMMARY OF THE INVENTION

According to a first aspect, the object of the invention is achieved by providing a charged particle system, such as a multi beam lithography system, comprising a manipulator device for manipulation of one or more charged particle beams, wherein the manipulator device comprises:

a planar substrate comprising at least one through opening in the plane of the planar substrate, wherein each through opening is arranged for passing at least one charged particle beam there through and each through opening is provided with electrodes arranged in a first set of multiple first electrodes along a first part of a perimeter of said through opening and in a second set of multiple second electrodes along a second part of said perimeter; and, an electronic control circuit arranged for providing voltage differences to pairs of a first electrode and a second electrode in dependence of a position of the first and second electrode along the perimeter of the through opening.

Charge particle beams can be manipulated (or deflected) by applying an electric field over a through opening, through which the beams pass. The characteristics of the electric field (e.g. strength and form) define, at least partly, the manipulation or deflection of the beam(s). An electric field can be created by applying a voltage over two electrodes that are arranged around the through opening. In that case, the strength and form of the electrical field will depend on the distance between those electrodes. Dividing each of said two electrodes in a set of multiple electrodes and providing voltage differences to the pairs of a first electrode and a second electrode in dependence of positions of the respective electrodes along the perimeter of the through opening allows adjustment of the electric field in the through opening. By providing a suitable voltage distribution, the electrical field can be optimized, for example to obtain a more homogeneous electric field in said through opening.

The first set of first multiple electrodes and the second set of second multiple electrodes may each consist of two electrodes or more, preferably of 2n electrodes, n being a natural number. The electrodes may be provided partly in and/or on the planar substrate.

Manipulator devices that are known in the art comprise two electrodes arranged on opposite sides of an opening. It has been found that the electrical field generated by such manipulator devices is not sufficiently homogeneous to manipulate the charged particle beam with sufficient accuracy. Because of the lack of homogeneity of the electrical field inside the opening, the manipulation of the charged particle beams or beamlets is dependent on the location where the beam is projected in the opening.

Because of this, beams are usually projected in a small centre part of the electrical field, where the electrical field is more or less homogeneous. However, this requires a relatively large through opening for a beam and only the centre part of the through opening is used for passing a beam there through. Evidently the manipulators that are known in the art use a small fill factor; that is the ratio between the cross-section area of the beam and the area of the through opening.

Since the manipulation device according to the invention provides a much more homogeneous field inside the through opening, the manipulation device is able to manipulate the beam with a higher accuracy than manipulator devices known in the art. Furthermore, the fill factor of the manipulator device according to the invention can be much higher than in manipulator devices known in the art. Due to the larger fill factor of the manipulators of the invention, the through openings for manipulating the beams can be much smaller than in the prior art. On the one hand, this can provide additional space between the through openings for arranging control circuitry. On the other hand, the through openings can be arranged much closer to each other for providing a larger beam density in a charged particle system according to an embodiment of the invention.

In an embodiment of the charged particle system according to the invention, the electronic control circuit is arranged for providing said voltage differences to said pairs in dependence of a distance between a first electrode and a second electrode of the respective pair. Preferably said voltage differences are directly proportional to said distance.

Since an electrical field generated by two electrodes is dependent on (or in particular, direct proportional to) the distance between the two electrodes, the homogeneity of the electrical field in the through opening may be improved by providing voltage difference in dependence of the distance between the first electrode and the second electrode.

In an embodiment of the charged particle system, a plane is defined between the first part of the perimeter and the second part of the perimeter, a line is defined between an electrode and a diametrically opposite other electrode and an angle alpha (α) is defined by said plane and line, wherein the electronic control circuit is arranged for providing voltage differences to said electrode and said other electrode in dependence of the angle alpha (α). Preferably said voltage differences are directly proportional to sin(α).

In an embodiment of the charged particle system, a plane is defined between the first part of the perimeter and the second part of the perimeter, a line is defined between a respective electrode and a centre of the though opening, and an angle beta (β) is defined by said plane and said line, wherein the electronic control circuit is arranged for providing voltages to respective electrodes in dependence of the angle beta (β). Preferably said voltages are directly proportional to sin(β).

The electrical field lines of the electrical field, generated by the electrodes, may be perpendicular to said plane. The strength of the electrical field may depend on the voltage applied to the respective electrodes and a distance of a respective electrode to said plane. Since both sin(α) and sin(β) are each a measure for the distance of a respective electrode to said plane, providing voltage (differences) in dependence of the angle alpha (α) or the angle (β) may enable providing a homogeneous electrical field.

In this document, a plane defined between the first part of the perimeter and the second part of the perimeter may be a plane defined centrally between the first part of the perimeter and the second part of the perimeter. The plane may comprise the central axis of the through opening.

In an embodiment of the charged particle system according to the invention, the electrodes are arranged substantially symmetrically with respect to said plane and/or the electrodes are uniformly distributed along said perimeter. Providing the electrodes symmetrically or/and uniformly distributed may increase the homogeneity of the electrical field across the through opening.

In an embodiment of the charged particle system, a plane is defined between the first part of the perimeter and the second part of the perimeter and the first electrode of said pair is located opposite to the second electrode of said pair with respect to the plane. In this case, the electrical field lines of the electrical field generated by the electrodes are at least substantially perpendicular to said plane.

In an embodiment of the charged particle system according to the invention, the electronic control circuit is arranged for providing a positive voltage V to the first electrode and a negative voltage −V to the second electrode. In an embodiment of the manipulator according to the invention, the electronic control circuit is arranged for providing a positive voltage V to two electrodes from the first set and preferably a negative voltage −V to two electrodes from the second set.

An advantage of providing multiple electrodes with the same voltage V or with the polarity inverted voltage −V is that this would require a relatively simple electronic control circuit.

In an embodiment of the charged particle system according to the invention, the manipulator device further comprises two electrodes arranged along the perimeter of the through opening and substantially on said plane, wherein the electronic control circuit is arranged for providing one voltage to each of said two electrodes, said one voltage preferably being an offset voltage and preferably being substantially equal to 0 Volt.

Since the electrical field lines of the homogeneous electrical field generated by the electrodes should be perpendicular to the plane, these two electrodes should be provided with the same voltage, such that the voltage difference between these two electrodes is 0 Volt. Providing these two electrodes with an (off-set) voltage of 0 volt (or grounding them) would require a relatively simple circuit. However, these two electrodes may also be provided with any other offset voltage, for example −1 kV. In both cases, the other electrodes may be provided with a voltage relative to this off-set voltage, for example with a positive voltage V and/or a negative voltage −V with respect to the offset voltage.

In an embodiment of the charged particle system, the electronic control circuit comprises resistors arranged as a voltage divider for providing voltages to respective electrodes, preferably as a feedback resistor of an operational amplifier. Preferably each of said first and/or second set of electrodes receives a maximum voltage, wherein said maximum voltage is then divided by said voltage divider for providing each electrode in a set of electrodes with a part of the maximum voltage.

Preferably said voltage divider is arranged for providing each electrode in a set of electrodes with a part of the maximum voltage, so that said voltages are proportional with the distance between a respective electrode and the above-mentioned plane.

In an embodiment said voltage divider comprises a set of resistors, which are preferably arranged around said through opening. A voltage divider is a relatively simple circuit for providing a number of different voltages on the basis of one particular maximum voltage. In a further embodiment, the voltage divider may comprise resistors with the same resistance. This would further increase the simplicity of the circuit.

An advantage of such a simple circuit is that it can be easily made, for example with lithography technologies. It may be integrated with other circuits in or on the planar substrate. The electronic control circuit may be at least partly arranged near to or in the vicinity of the through openings.

In an embodiment of the charged particle system according to the invention, the electronic control circuit comprises a first operational amplifier with a voltage divider as a feedback resistor for providing voltages to the first electrodes, and a second operational amplifier with a voltage divider as a feedback resistor for providing voltages to the second electrodes.

In an embodiment of the charged particle system, the electronic control circuit further comprises a digital-to-analogue converter for outputting a single control signal to the first and the second operational amplifier and a polarity inverter arranged for inverting a polarity of said control signal, wherein the first operational amplifier is directly connected to the digital-to-analogue converter to receive said control signal and the second operational amplifier is connected to the digital-to-analogue converter via said polarity inverter to receive an inverted control signal.

An advantage of this embodiment is the relatively simple circuit: only a single digital-to-analogue-converter is required that outputs a single control signal to the first operational amplifier. The same control signal is provided to the second operational amplifier after inversion of the polarity of the signal by the polarity inverter.

In another embodiment, the electronic control circuit comprises two digital-to-analogue-converters for outputting two control signals to the first and the second operational amplifier respectively.

In an embodiment of charged particle system according to the invention, gaps are provided between adjacent electrodes. The perimeter of said through opening consists of a first area covered by the electrodes and a second area covered by the gaps, and an electrode-to-gap ratio is defined by said first area divided by said second area. In an embodiment said electrode-to-gap ratio is in the range of 5-15, or preferably substantially 10.

When adjacent electrodes are provided closer to each other, the generated electrical field could be more homogeneous. However, this is also more difficult to produce. It appears that with an electrode-to-gap ratio being in the range of 5-15, or preferably substantially 10, the two effects are optimally balanced.

In an embodiment of the charged particle system according to the invention, the manipulator comprises a cross-talk shield, the cross-talk shield comprising a planar shield substrate comprising at least one through opening in the plane of the planar shield substrate, wherein the at least one through opening of the planer shield substrate is arranged in alignment with the at least one through opening of the planar substrate. An advantage of a cross-talk shield is that it prevents to some extend cross-talk between electrodes of the same through opening, between electrodes of different through openings and/or between an electrode and other circuitry present in the vicinity of the electrode.

In an embodiment of the charged particle system according to the invention, a distance between the planar substrate and the planar shield substrate is smaller than 10 micrometer, preferably smaller than 5 micrometer and more preferably about 3 micrometer. In an embodiment of the manipulator according to the invention, a thickness of the shield planar substrate is about a diameter of the at least one through opening of the planar substrate.

In an embodiment of the charged particle system according to the invention, the charged particle system further comprises:
 a first planar lens substrate comprising at least one first planar lens aperture, wherein the at least one first planar lens aperture is arranged in alignment with the at least one through opening of the planar substrate of the manipulator device and the first planar lens substrate is arranged above and parallel with the planar substrate of the manipulator device; and,
 a second planar lens substrate comprising at least one second planar lens aperture, wherein the at least one second planar lens aperture is arranged in alignment with the at least one through opening of the planar substrate of the manipulator device and the second planar lens substrate is arranged below and parallel with the planar substrate of the manipulator device,
wherein the system is arranged for providing a voltage difference between the first planar lens substrate and the planar substrate of the manipulator device and between the planar substrate of the manipulator device and the second planar lens substrate for generating an Einzel lens for said beams.

In this embodiment, the manipulator device forms a part of an Einzel lens, comprising the first and second planar lens substrate and the planar substrate of the manipulator device in between. This Einzel lens may be arranged for focusing or projecting the charged particle beam.

In this way, the manipulator device may be integrated in the Einzel lens and this combined device may require less space in the charged particle system than providing a separate manipulator device and a separate Einzel lens.

And because of the compactness of the combined device, the effects of angular alignment errors may be limited.

The terms "above" and "below" in this document are defined with respect to the direction of a charged particle beam which passes through a though opening. The beam may travel or be directed from an upper part of the charged particle system to a lower part of the charged particle system.

In an embodiment of the charged particle system according to the invention, the charged particle system further comprises a planar current limiter substrate, comprising at least one current limiter aperture, wherein the current limiter planar substrate is arranged above the planar substrate of the manipulator device and the at least one current limiter aperture is arranged in alignment with the at least one through opening of the planar substrate of the manipulator device.

An advantage of providing a current limiter is that it may enhance the homogeneity of the beams. The beam intensity of a beam may be more homogeneous in the centre of the beam than in the radial outer parts of the beam. The cross-sectional area of the beams projected on the current limiter can be arranged to be larger than the area of the respective current limiter aperture. In this case, the outer charged particles (for example electrons) of the beam will be absorbed by the current limiter and the overall homogeneity of the remaining beam will be improved.

In an embodiment of the charged particle system according to the invention, the at least one current limiter aperture is smaller than the at least one through opening of the planar substrate of the manipulator device. In an embodiment, a cross-sectional area of the at least one through opening of the planar substrate of the manipulator device is in the range of 50%-95% or preferably in the range of 70-90% of a cross-sectional area of the at least one current limiter aperture.

In this way, the cross-section of the beam passing through the though opening may be significantly smaller than the through opening itself. This would reduce the number of charged particles (for example electrodes) that hit or contact the planar substrate of the manipulator device. And this would reduce the damage these charged particles may cause to the electronic control circuit provided at least partly on or in the planar substrate of the manipulator device.

In an embodiment of the charged particle system according to the invention,
 said manipulator device is a first manipulator device arranged for deflecting the one or more charged particle beams in an x-direction;
 the charged particle system further comprises a second manipulator device according to any embodiment described above, arranged for deflecting said one or more charged particle beams in an y-direction, wherein the x-direction is perpendicular to the y-direction, wherein the second manipulator device is arranged parallel with and adjacent to the first manipulator device and the at least one through opening of the second manipulator device is arranged in alignment with the at least one through opening of the first manipulator device, wherein the system is arranged for providing a voltage difference between the first planar lens substrate and the second planar substrate of the first manipulator device and between the planar substrate of the second manipulator device and the second planar lens substrate for generating an Einzel lens for said beams.

In this embodiment, the two manipulator devices form a part of an Einzel lens, comprising the first and second planar lens substrate and the planar substrates of the two manipulator device in between.

Also in this embodiment, the manipulator devices may be integrated in the Einzel lens and this combined device may be more compact than providing two separate manipulator device and a separate Einzel lens.

In an embodiment of the charged particle system according to the invention, the first and second planar lens substrate are grounded and the system is arranged for providing a negative voltage to the planar substrate(s) of the manipulator device (s), wherein said negative voltage is preferably in the range of −1500 Volt to −500 Volt, or more preferably about −1000 Volt or −1 kV.

In charged particle systems, so called secondary electrons may be generated by the charged particles of the charged particle beam when they hit or are in contact with surfaces in the charged particle system, for example the surface of the target. These secondary electrons may cause damage to the manipulator device(s). By providing the a negative voltage, for example of about −1 kV to the planar substrate of the manipulator device(s), these secondary electrons may be deflected away from the manipulator device(s).

According to a second aspect, the invention provides a manipulator device for manipulating a charged particle beam in a charged particle system, such as a multi beam lithography system, according to any of the embodiments described above.

According to a third aspect, the invention provides a charged particle system such as a multi beam lithography system, comprising:

a manipulator device for manipulation of one or more charged particle beams, comprising a planar substrate comprising at least one through opening in the plane of the planar substrate, wherein each through opening is arranged for passing at least one charged particle beam there through;

a first planar lens substrate comprising at least one first planar lens aperture, wherein the at least one first planar lens aperture is arranged in alignment with the at least one through opening of the planar substrate of the manipulator device and the first planar lens substrate is arranged above and parallel with the planar substrate of the manipulator device; and, a second planar lens substrate comprising at least one second planar lens aperture, wherein the at least one second planar lens aperture is arranged in alignment with the at least one through opening of the planar substrate of the manipulator device and the second planar lens substrate is arranged below and parallel with the planar substrate of the manipulator device, wherein the system is arranged for providing a voltage difference between the first planar lens substrate and the planar substrate of the manipulator device and between the planar substrate of the manipulator device and the second planar lens substrate for generating an Einzel lens for said beams.

In an embodiment of the charged particle system according to the invention, the charged particle system further comprises a planar current limiter substrate, comprising at least one current limiter aperture, wherein the current limiter planar substrate is arranged above the planar substrate of the manipulator device and the at least one current limiter aperture is arranged in alignment with the at least one through opening of the planar substrate of the manipulator device.

In an embodiment of the charged particle system according to the invention, the at least one current limiter aperture is smaller than the at least one through opening of the planar substrate of the manipulator device.

In an embodiment of the charged particle system according to the invention, the charged particle system further comprises cooling tubes for transporting a cooling fluid, wherein said cooling tubes are arranged around the at least one current limiter aperture.

In an embodiment of the charged particle system according to the invention,
said manipulator device is a first manipulator device arranged for deflecting the one or more charged particle beams in an x-direction;
the charged particle system further comprises a second manipulator device arranged for deflecting said one or more charged particle beams in an y-direction, wherein the x-direction is perpendicular to the y-direction, the second manipulator device comprising a planar substrate comprising at least one through opening in the plane of the planar substrate, wherein each through opening is arranged for passing at least one charged particle beam there through, wherein the second manipulator device is arranged parallel with and adjacent to the first manipulator device and the at least one through opening of the second manipulator device is arranged in alignment with the at least one opening of the first manipulator device,
wherein the system is arranged for providing a voltage difference between the first planar lens substrate and the planar substrate of the first manipulator device and between the planar substrate of the second manipulator device and the second planar lens substrate for generating an Einzel lens for said beams.

In an embodiment of the charged particle system according to the invention, the charged particle system further comprises cooling tubes for transporting a cooling fluid, wherein said cooling tubes are arranged between the first and the second manipulator device.

Both the first and the second manipulator device may deform due to thermal expansion. When the cooling tubes are arranged between the first and the second manipulator device, the manipulator devices will expand symmetrically. This may prevent the manipulator devices from bending.

In an embodiment of the charged particle system according to the invention, the electrodes arranged in a first set of multiple first electrodes and in a second set of multiple second electrodes and the electronic control circuit form a single CMOS device.

According to a fourth aspect, the invention provides a charged particle system such as a multi beam lithography system, comprising:

a first manipulator device arranged for deflecting one or more charged particle beams in an x-direction, the first manipulator device comprising a planar substrate comprising at least one through openings in the plane of the planar substrate, wherein each through opening is arranged for passing at least one charged particle beam there through; and, a second manipulator device arranged for deflecting said one or more charged particle beams in an y-direction, wherein the x-direction is perpendicular to the y-direction, the second manipulator device comprising a planar substrate comprising at least one through opening in the plane of the planar substrate, wherein each through opening is arranged for passing at least one charged particle beam there through, wherein the second manipulator device is arranged parallel with and adjacent to the first manipulator device and the at least one through opening of the second manipulator device is arranged in alignment with the at least one opening of the first manipulator device;

wherein the first and the second manipulator device each form a single CMOS device.

According to a fifth aspect, the invention provides a charged particle system such as a multi beam lithography system, comprising:

a first manipulator device arranged for deflecting one or more charged particle beams in an x-direction, the first manipulator device comprising a planar substrate comprising at least one through opening in the plane of the planar substrate, wherein each through opening is arranged for passing at least one charged particle beam there through; and, a second manipulator device arranged for deflecting said one or more charged particle beams in an y-direction, wherein the x-direction is perpendicular to the y-direction, the second manipulator device comprising a planar substrate comprising at least one through opening in the plane of the planar substrate, wherein each through opening is arranged for passing at least one charged particle beam there through, wherein the second manipulator device is arranged parallel with and adjacent to the first manipulator device and the at least one through opening of the second manipulator device is arranged in alignment with the at least one opening of the first manipulator device;

cooling tubes arranged for transport a cooling fluid, wherein the cooling tubes are arranged between the first and the second manipulator device.

According to a sixth aspect, the invention provides a charged particle system such as a multi beam lithography system, comprising a manipulator device for manipulation of one or more charged particle beams, wherein the manipulator device comprises:

a planar substrate comprising at least one through opening in the plane of the planar substrate, wherein each through opening is arranged for passing at least one charged particle beam there through and each through opening is provided with electrodes arranged in a first set of multiple first electrodes along a first part of a perimeter of said through opening and in a second set of multiple second electrodes along a second part of said perimeter; and, an electronic control circuit arranged for providing different voltages to at least two first electrodes of the first set of multiple first electrodes.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
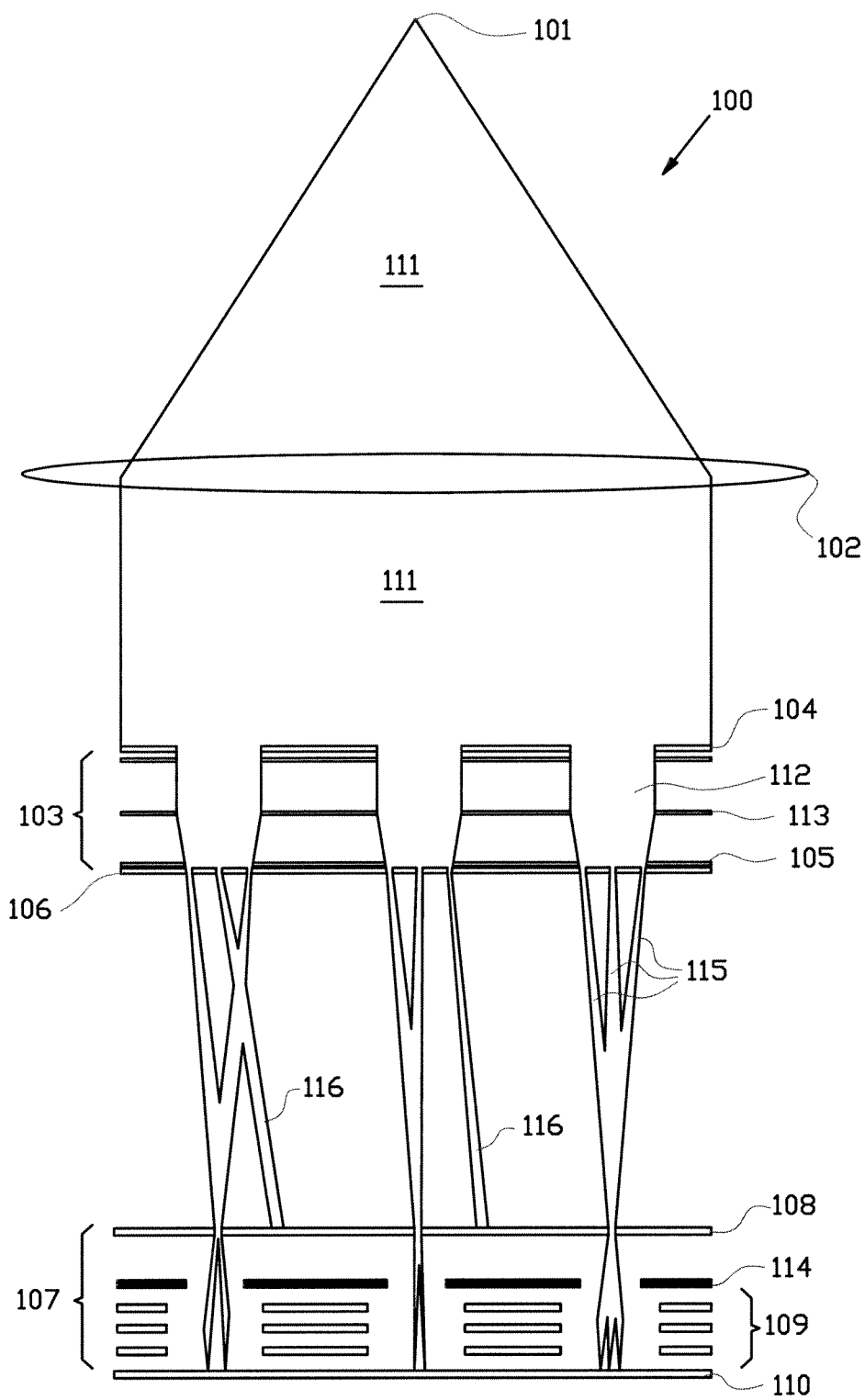
FIG. 1 shows a schematic overview of a part of an embodiment of a charged particle system according to the invention.

FIG. 1 shows a schematic overview of a part of a charged particle multi-beam or multi-beamlet lithography system 100 according to an embodiment of the invention for processing at least a part of a target 110, which may be a wafer. In an embodiment of the invention, the lithography system is without common cross-over of all the charged particle beams or beamlets and/or maskless.

The lithography system as shown in FIG. 1 comprises a charged particle source 101, for example an electron source, for producing an expanding charged particle beam 111. The expanding beam passes a collimator lens 102 for collimating the charged particle beam 111.

Subsequently the collimated beam 111 impinges on an aperture array 104, which blocks part of the collimated beam 111 for creating sub-beams 112. The sub-beams 112 impinge on a further aperture array 105 for creating beamlets 115. A condenser lens array 103 (or set of condenser lens arrays) is provided for focusing the sub-beams 112 towards a corresponding opening in the beam stop array 108 of end module 107.

The beamlet creating aperture array 105 is preferably included in combination with a beamlet blanker array 106, for example arranged close together with aperture array 105 before the blanker array 106. The condenser lens or lenses 103 may focus sub-beam 112 either in or towards a corresponding opening in beam stop array 108 of end module 107.

In this example, the aperture array 105 produces three beamlets 115 from sub-beam 112, which strike the beam stop array 108 at a corresponding opening so that the three beamlets 115 are projected onto the target 110 by the projection lens system 109 in end module 107. In practice a group of beamlets with a much larger number of beamlets may be produced by aperture array 105 for each projection lens system 109 in end module 107. In a practical embodiment typically around fifty beamlets (for example 49 beamlets generated by a 7×7 aperture array) may be directed through a single projection lens system 109, and this may be increased to two hundred or more.

However, it is also possible that the aperture array 105 produces only one beamlet 115 for each single projection lens system 109. In that case, aperture array 104 may be omitted.

The beamlet blanker array 106 may deflect individual beamlets in a group of beamlets 115 at certain times in order to blank them. This is illustrated by blanked beamlet 116, which has been deflected to a location on the beam stop array 108 near to but not at an opening.

It may be understood that the term beam in this document, in particular in the enclosed claims, may refer to beam 111, sub-beam 112 and beamlets 115. The charged particle optical column may be provided with one or more manipulator devices according to the invention at different locations in the charged particle system or in particularly at different locations in its optical column.

A manipulator device 113 according to the invention may be arranged behind the collimator lens 102 for:
  providing a deflection in a plane substantially perpendicular to an optical axis of the charged particle optical column in order to correct for misalignments of one or more of the devices of charged particle optical column, and/or
  providing a correction for any astigmatism which may be caused by a macroscopic lens—usually a magnetic lens—which diffracts the whole beam 111, all sub-beams 112 or all beamlets 115, such as the collimator lens 102.

A manipulator device according to the invention may also be arranged behind the beamlet blanker array 106 (not shown in FIG. 1).

Figure 2:
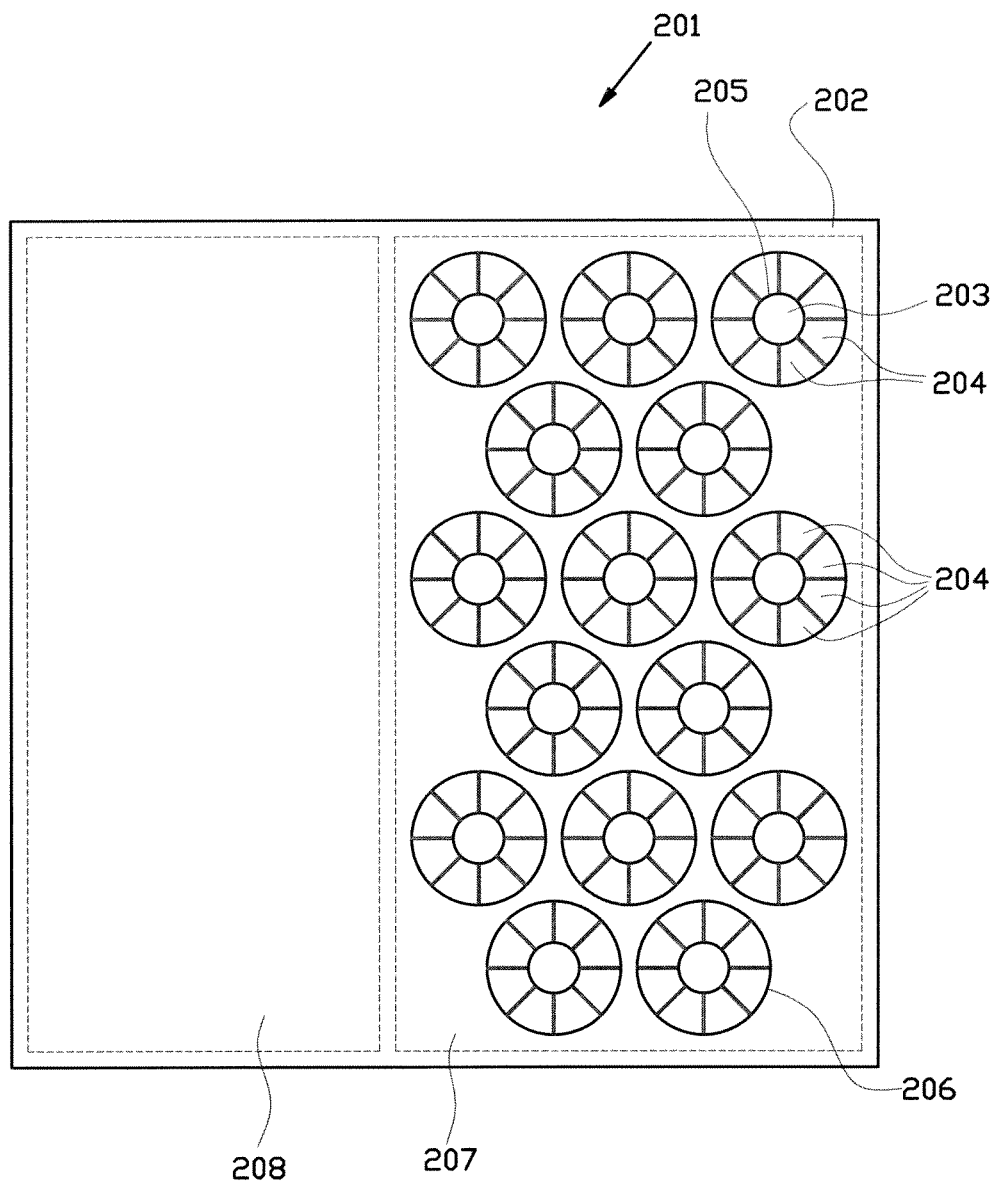
FIG. 2 shows a schematical overview of a part of an embodiment of a manipulator device according to the invention.

A manipulator device 114 according to the invention may be provided as part of the end module 107 for providing a two dimensional deflection in the projection lens system 109 and, possibly enabling a vector scan of the beamlets in one group. Said dimension deflection may take place at a high frequency, i.e. a higher frequency than manipulation takes place in manipulator device 113. FIG. 2 shows a schematical overview of a part of an embodiment of a manipulator device 201 according to the invention. This embodiment may be used as manipulator device 113 or manipulator device 114 in FIG. 1.

The manipulator device 201 comprises a planar substrate 202 comprising an array of through openings 203 in the plane of the planar substrate. Through the through openings 203 one or more charged particle beamlets may pass. The through openings 203 extend substantially transverse to the surface of the planar substrate 202. Each of openings 203 may be provided with electrodes 204 along the perimeter 205 of through opening 203.

The through openings 203 may be grouped in so-called beam areas 207. Adjacent to the beam areas 207 non-beam areas 208 are provided on the planar substrate 202. In the non-beam areas electronic circuits (such as an electronic control circuit) may be at least partly provided to control the operation of the electrodes 204 in the beam area 207.

The number of electrodes may vary but is preferably in the range of 16-32 electrodes or 26. In general, the number of electrodes may be multiple of 2 or 4 electrodes, or may be equal to 2 k or 4 k, k being a natural number.

When the number of electrodes is even and the electrodes are arranged uniformly distributed along the perimeter of the through opening, it may be the case that a rotation of the electrodes 204 by 90 degrees around a centre axis of the through opening would yield the same distribution of the electrodes along the perimeter.

The manipulator device 201 may comprise an array of manipulators 206, each comprising a through opening 203 and electrodes 204 arranged around the through opening 203. The manipulators 206 preferably have lateral sizes ranging from approximately 150 micrometers to 2 micrometers, depending on their purpose. The manipulator may be regularly arranged in rows and columns, as for example is shown in FIG. 2.

One of the challenges is to design electrodes with a fabrication process that is compatible with chip fabrication and electron optical design rules. Furthermore it is desirable to control thousands of beams without having thousands of external control wires.

The manipulator device may be manufactured using MEMS technology. This fabrication process is bipolar compatible allowing local electronics to be incorporated, for example the electronic control circuit. The local electronics (such as an electronic control circuit) may be arranged between the through openings or adjacent to the through openings or to the electrodes 204.

Figure 3A:
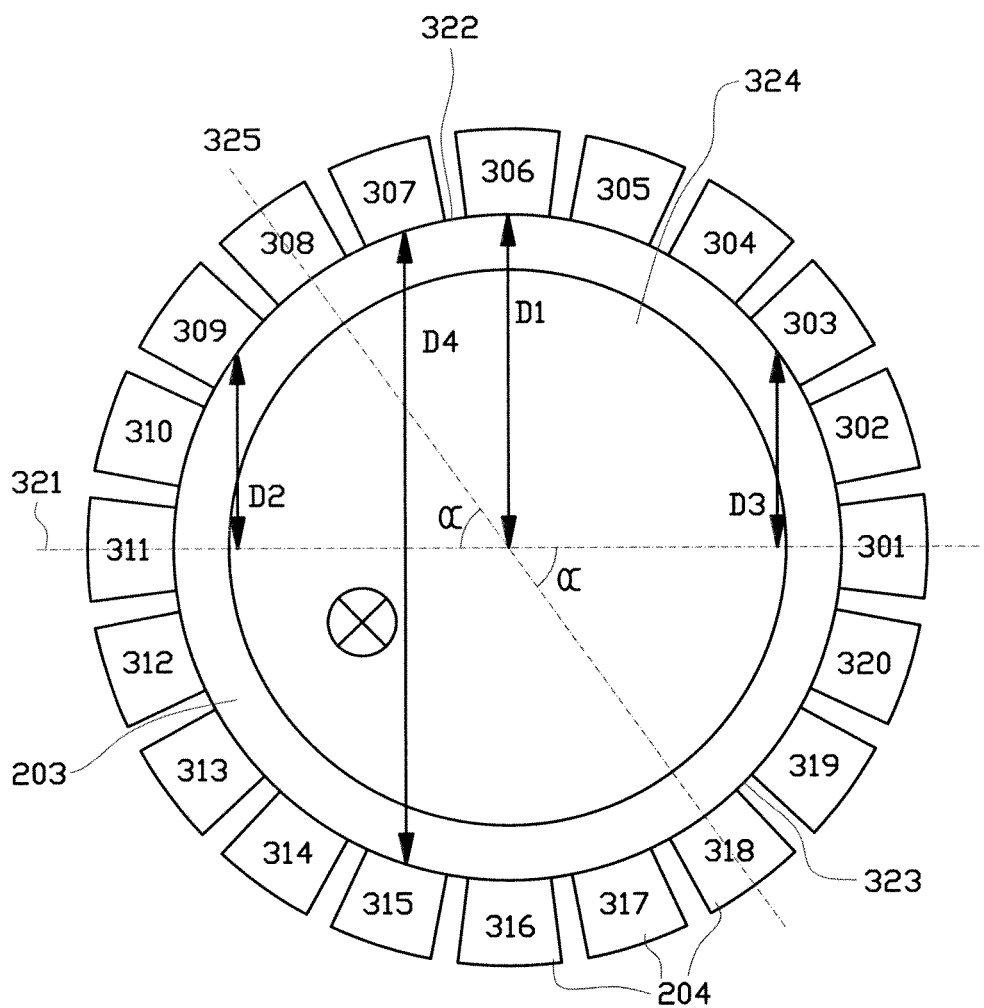
FIG. 3A shows a schematical overview of a part of an embodiment of a manipulator device according to the invention.
Figure 3B:
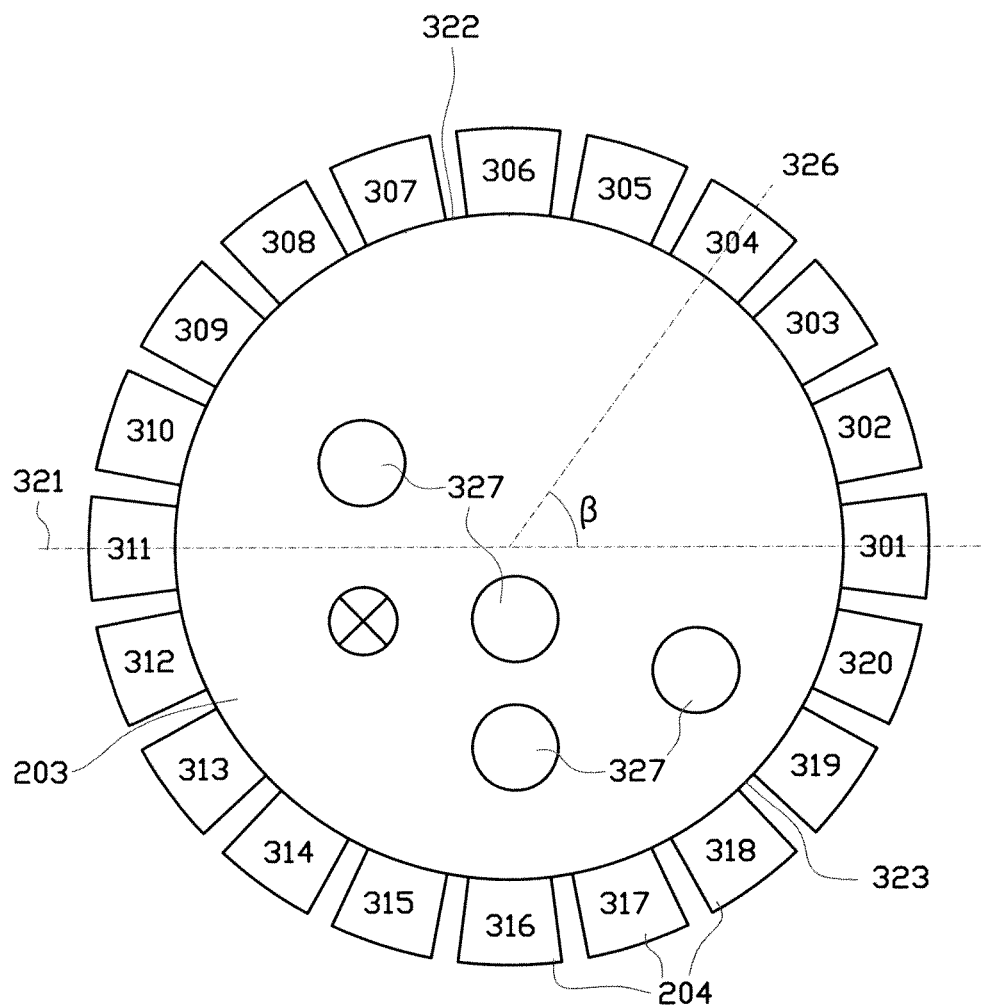
FIG. 3B shows a schematical overview of a part of an embodiment of a manipulator device according to the invention.

FIGS. 3A and 3B show a schematical overview of a part of an embodiment of a manipulator according to the invention. In the example of FIG. 3 the through opening 203 is provided with 20 electrodes 301-320 along the perimeter of the through opening 203. When operational, a beam may enter the through opening 203 in a direction into the paper. This direction may be parallel with the optical axis of the optical column or with a central axis of the through opening. The cross-sectional area of one beam passing the through opening 203 is indicated by 324 in FIG. 3A. In FIG. 3B the cross-sectional area of multiple beams passing the through opening 203 is indicated by 327. In FIG. 3A the cross-sectional area of only four beams are indicated, but more beam could pass through the through opening, for example 49 beams.

A plane 321 may be defined parallel with the central axis of the through opening and may comprise said central axis. It may be understood that all planes and lines mentioned in this document are imaginary. A first set of first electrodes 302-310 has been arranged along a first part 322 of the perimeter and a second set of second electrodes 312-320 has been arranged along a second part 323 of the perimeter. The first set of first electrodes 302-310 is arranged opposite to the second set of electrodes 312-320 with respect to the plane 321. The plane 321 is defined centrally between the first and second set of electrodes.

The electrodes according to this example, are arranged substantially symmetrically with respect to the plane 321 and the electrodes are uniformly distributed along said perimeter, as can be seen in FIGS. 3A and 3B.

A voltage may be applied or provided to each of the electrodes by an electronic control circuit (not shown in FIG. 3). To the voltages provided to each electrode may be referred to as V<number of the electrode>, for example, a voltage V306 may be applied to electrode 306 and a voltage V309 may be applied to electrode 309.

The electronic control circuit may be arranged for providing voltage differences to pairs of a first electrode and a second electrode in dependence of positions of the respective electrodes along the perimeter of the through opening. It may be the case that, the first electrode of a pair from the first set and the second electrode of said pair from the second set are be arranged opposite to each other with respect to plane 321. For example, in FIG. 3, first electrode 307 from the first set of electrodes 302-310 and second electrode 315 from the second set of electrodes 312-320 are arranged opposite with respect to plane 321. A distance between the electrodes of the pair is indicated by 94.

The electronic control circuit is arranged for providing said voltage differences to said pair of first electrode 307 and second electrode 315 in dependence of the distance D4, wherein preferably said voltage differences are directly proportional to said distance D4.

In FIG. 3A, a distance between electrode 306 and plane 321 is indicated by arrow D1, while a distance between electrode 309 and plane 321 is indicated by D2. And a distance between electrode 303 and the plane is indicated by D3. The electronic control circuit may be arranged for providing voltages to the electrodes in dependence of a distance between a respective electrode and said plane.

For example in FIG. 3A, because the distances D1 and D2 are different, the voltage V306 and V309 provided by the electronic control circuit is also different. The voltages V309 and V303 may be (substantially) identical, since the distances D2 and D3 are also (substantially) identical.

In an embodiment, the voltages increase with said distance, preferably proportionally. In the example of FIG. 3, voltage V306 may be higher than V309 or may be equal to the ratio D1/D2 times the voltage V309. This may also be applicable to the other electrodes 204, mutatis mutandis.

Among the electrodes 204 a first electrode from the first set of electrodes 302-310 (i.e. a set of the so-called first electrodes) and a second electrode from the second set of electrodes 312-320 (i.e. a set of the so-called second electrodes) may be arranged diametrically across the through opening 203. For example, in FIG. 3A, first electrode 308 from the first set and second electrode 318 from the second set are arranged diametrically. A line connecting the (positions of) the first electrode 308 and second electrode 318 has been indicated by 325 in FIG. 3A. The plane 321 and this line 325 define an angle alpha ($\alpha$), as is shown in FIG. 3A. It may be understood that the angle alpha ($\alpha$) depends on the distance between electrode 308 and plane 321. The electronic control circuit may be arranged for providing voltages to the electrodes in dependence of said angle alpha ($\alpha$), or in particular in dependence of $\sin(\alpha)$.

A line connecting an electrode and the centre of the through opening may define an angle with said plane. In the example of FIG. 3 is an angle beta ($\beta$) defined by the plane 321 and line 326 connecting electrode 304 and the centre of the through opening 203. The electronic control circuit may be arranged for providing a voltage to an electrode in dependence of said angle beta ($\beta$). The voltage may be (directly) proportional to $\sin(\beta)$.

It may be the case that the voltages provided by the electronic control circuit is a function of angle beta ($\beta$), or more particular the provided voltage is a function of the sinus of angle beta ($\beta$), such as:

$$V(\beta) = V\max \cdot \sin(\beta)$$

Figure 4:
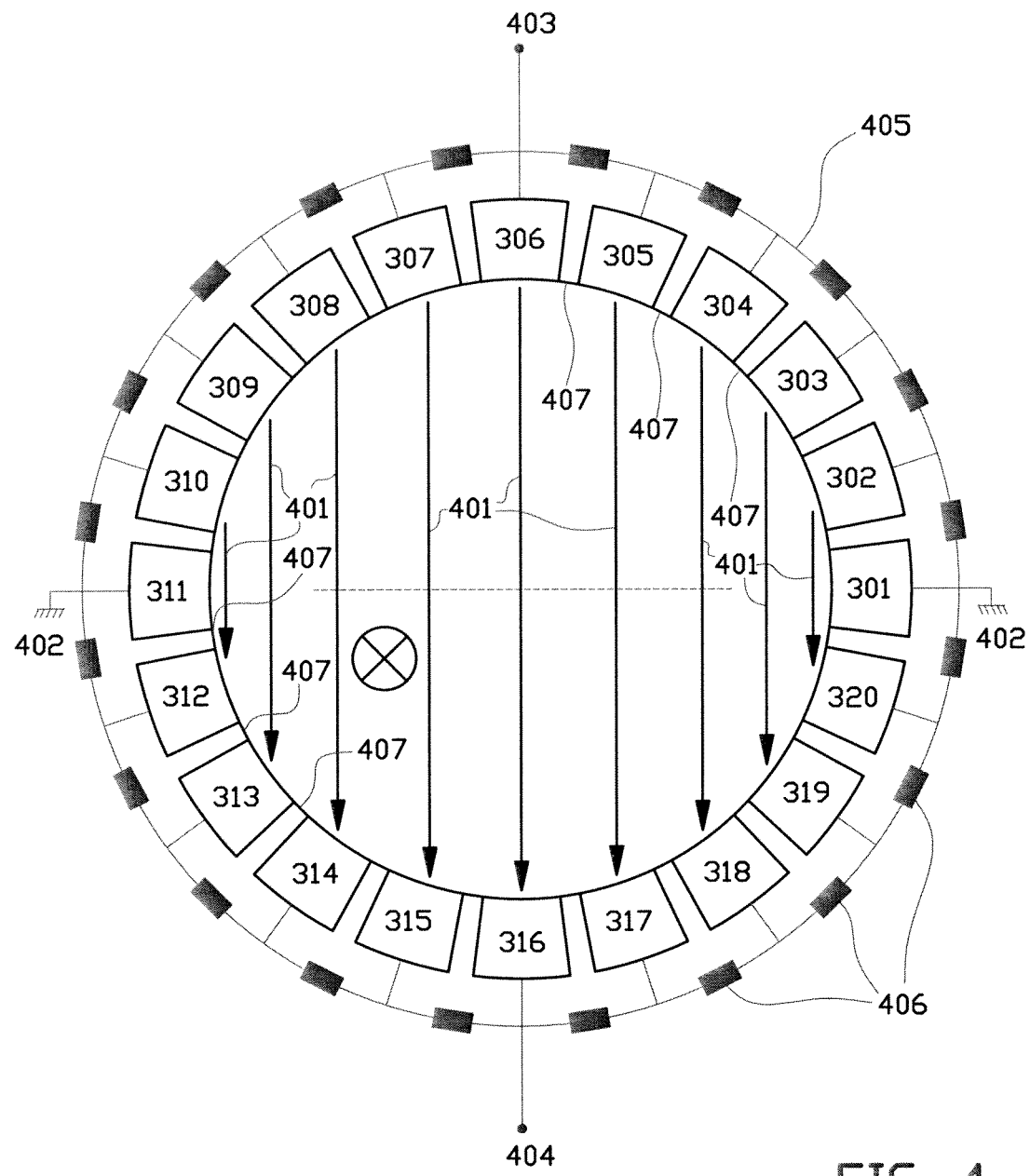
FIG. 4 shows a schematical overview of a part of an embodiment of a manipulator device according to the invention.

FIG. 4 shows a schematical overview of a part of an embodiment of a manipulator according to the invention. The electronic control circuit may be arranged for providing a voltage V to two electrodes from the first set, and preferably a voltage −V to two electrodes from the second set. In the example of FIG. 3, voltage V309 may thus be identical to voltage V303. And voltage V313 may thus also be identical to voltage V319 and V313=−V309. The electronic control circuit may be arranged for providing a positive voltage V to the first electrode and a negative voltage −V to the second electrode of a pair. In the example of FIG. 3, voltage V307 may thus be V307=−V315.

The electrodes 204 may comprise two electrodes arranged along the perimeter of the through opening and substantially on the plane 321 and the electronic control circuit may be arranged for providing a voltage to each of said two electrodes, said voltage preferably being an offset voltage. The offset voltage may be substantially equal to 0 Volt. In the example of FIG. 3, electrodes 311 and 301 are arranged substantially on plane 321 and may be connected with the ground potential, providing a voltage of at least substantially 0 volt, as is indicated by 402 in FIG. 4.

However, as explained below, the offset voltage may also be around −1 kV with respect to the ground, when the planar substrate 202 is part of an Einzel lens. The voltages of the electrodes 204 may be defined with respect to the offset voltage. In that case, when V306 is said to be 20 volt and the offset voltage is −1 kV, it indicates a voltage V306=−1020 volt with respect to the ground.

In FIG. 4, the electrical field lines of the electrical field generated by the electrodes 204 have been indicated by arrows 401. Because the voltages may be provided to the electrodes 204 as described above, the electrical field may substantially homogeneous. Because the electrical field is substantially homogeneous across the through opening, the manipulation of the charged particles that passes through the through opening will take place regardless the position of the charged particles in the through opening. This improves the accuracy of the manipulation of the beamlets.

However, the through opening 203 may be a circle (as is depicted in the figures), but may also have an ellipse shape or any other shape, for example because of errors in the production process. In that case, the voltages provided by the electronic control circuit may be adjusted to correct these errors in order to obtain a substantially homogeneous electrical field.

Furthermore, it may be the case that the beamlets are not centrally projected on the manipulator or does not have a circular cross-sectional area (not indicated in the figures). In that case, the voltages provided by the electronic control circuit may be adjusted in order to correct theses errors.

In the example of FIG. 4, the electronic control circuit comprises a number of resistors 406 connected in series. The number of resistors may be equal to the number of electrodes. The resistance of these resistors may be selected in order to provide a voltage to each of said electrodes which voltage changes around the through opening. The voltage of a particular electrode is a function of the position of the electrode around the through opening. Such a function be may a sinus function.

An electrode, for example electrode 306, may be connected to a voltage V306=Vmax via connection 403, while another electrode, for example electrode 316, may be connected to a voltage V316=−Vmax via connection 404. The voltage Vmax may be in the range of 1-50 or in the range of 5-25, or about 20 Volt.

Electrodes 301 and 311 may be provided with the same voltage. They may be grounded or provided with a voltage V310=V311=0 Volt. In this way, four voltage dividers have been arranged for dividing voltages Vmax and −Vmax into respective voltages.

This yields a relatively simple electronic control circuit, which may be easily provided around each through opening 203, for example in the planar substrate 202 of the manipulator device 201 of FIG. 2. The electronic control circuit may be provided on the non-beam area 208 of the planar substrate 202 or may be provided around the through opening 203 in the beam-area 207.

It may be understood that the voltages provided to the electrodes of one through opening may also be provided to the electrodes of another through opening, preferably by the same electronic control circuit.

Between adjacent electrodes 204 gaps 407 may be provided. The perimeter of the through opening may thus be covered by electrodes 204 and gaps 407. An electrode-to-gap ratio may be defined as a first area of the perimeter covered by the electrodes divided by a second area of the perimeter covered by the gaps. The electrode-to-gap ratio may be considered as a measure for the distance between adjacent electrodes. When the distance between adjacent electrodes is small, a more homogeneous electrical field may be provided, but any cross-over between the adjacent electrodes is also more likely. An optimal balance has been found at an electrode-to-gap ratio in the range of 5-15, or preferably substantially 10.

Figure 6A:
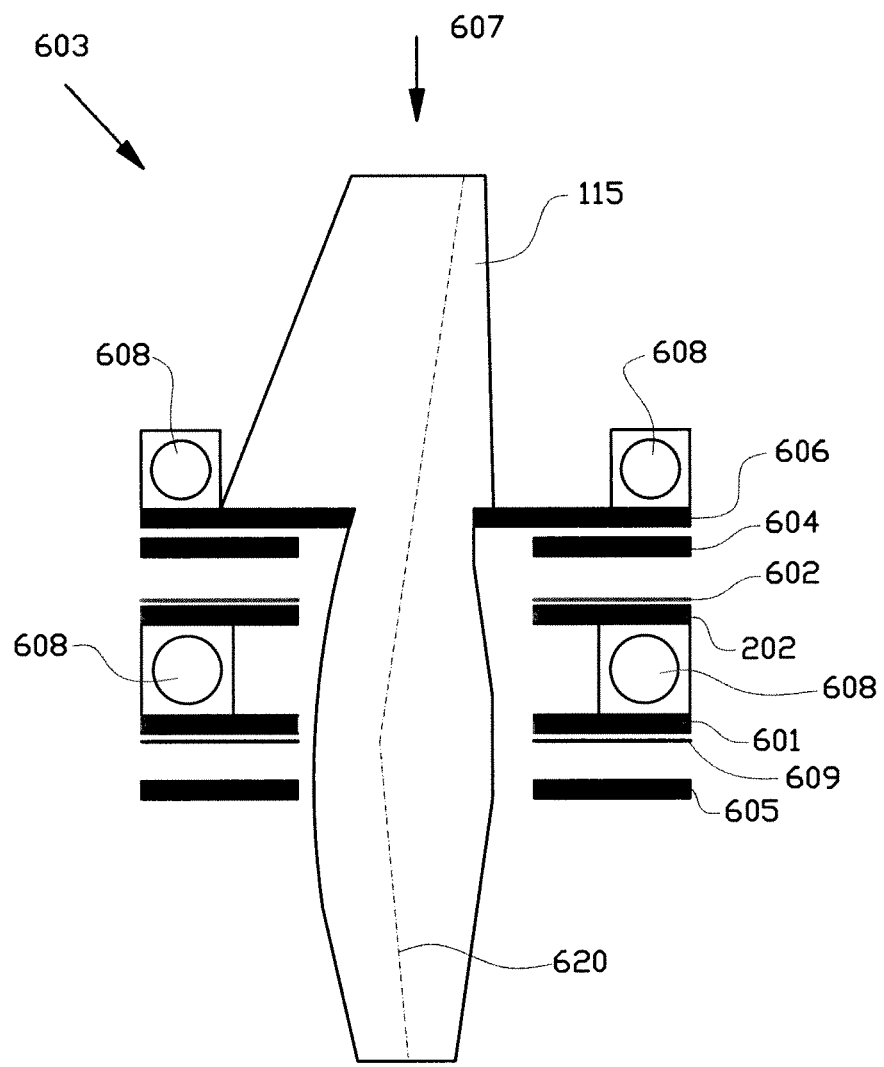
FIG. 6A shows a schematical overview of a part of an embodiment of a charged particle system according to the invention.

In order to (further) minimize the cross-talk between an electrode and other circuits in the vicinity of the electrode, or between electrodes provided around one or more through openings, the manipulator device may be provided with a cross-talk shield 602 (not shown in FIG. 4, but in FIG. 6A). The cross-talk shield may comprise a planar shield substrate comprising an array of through openings in the plane of the planer shield substrate, wherein the through openings of the planer shield substrate are arranged in alignment with the through openings of the planar substrate.

The cross-talk shield provides an electrical shielding of electrodes 204 against electro(magnetic) fields of any other circuitry in the vicinity of the electrodes. It appears that the shielding is at its optimum when a distance between the planar substrate and the planar shield substrate is smaller than 10 micrometer and/or a thickness of the shield planar substrate is about a diameter of the through openings of the planar substrate.

Figure 5A:
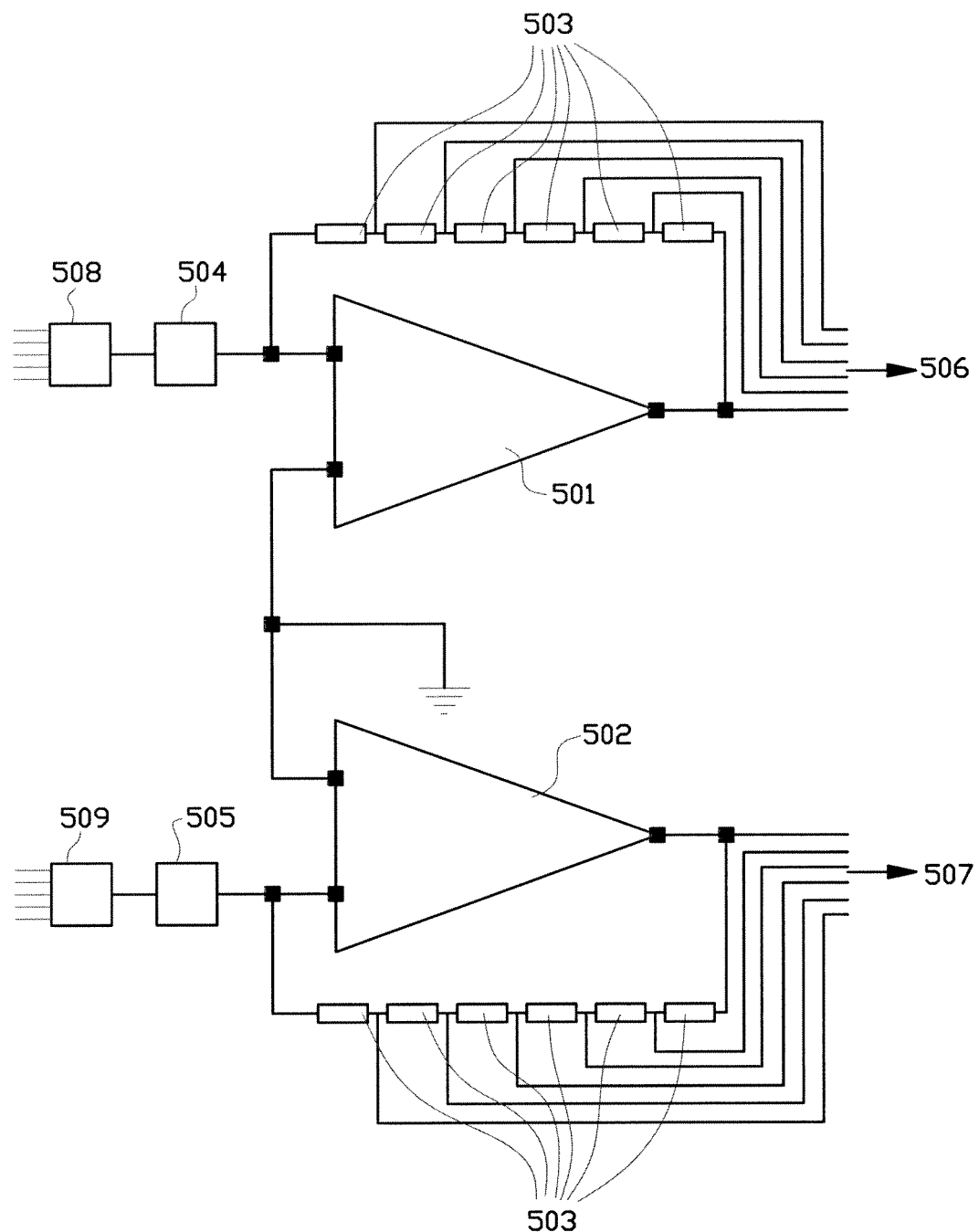
FIG. 5A shows a schematical overview of a part of an electronic control circuit for use in a manipulator device according to the invention.
Figure 5B:
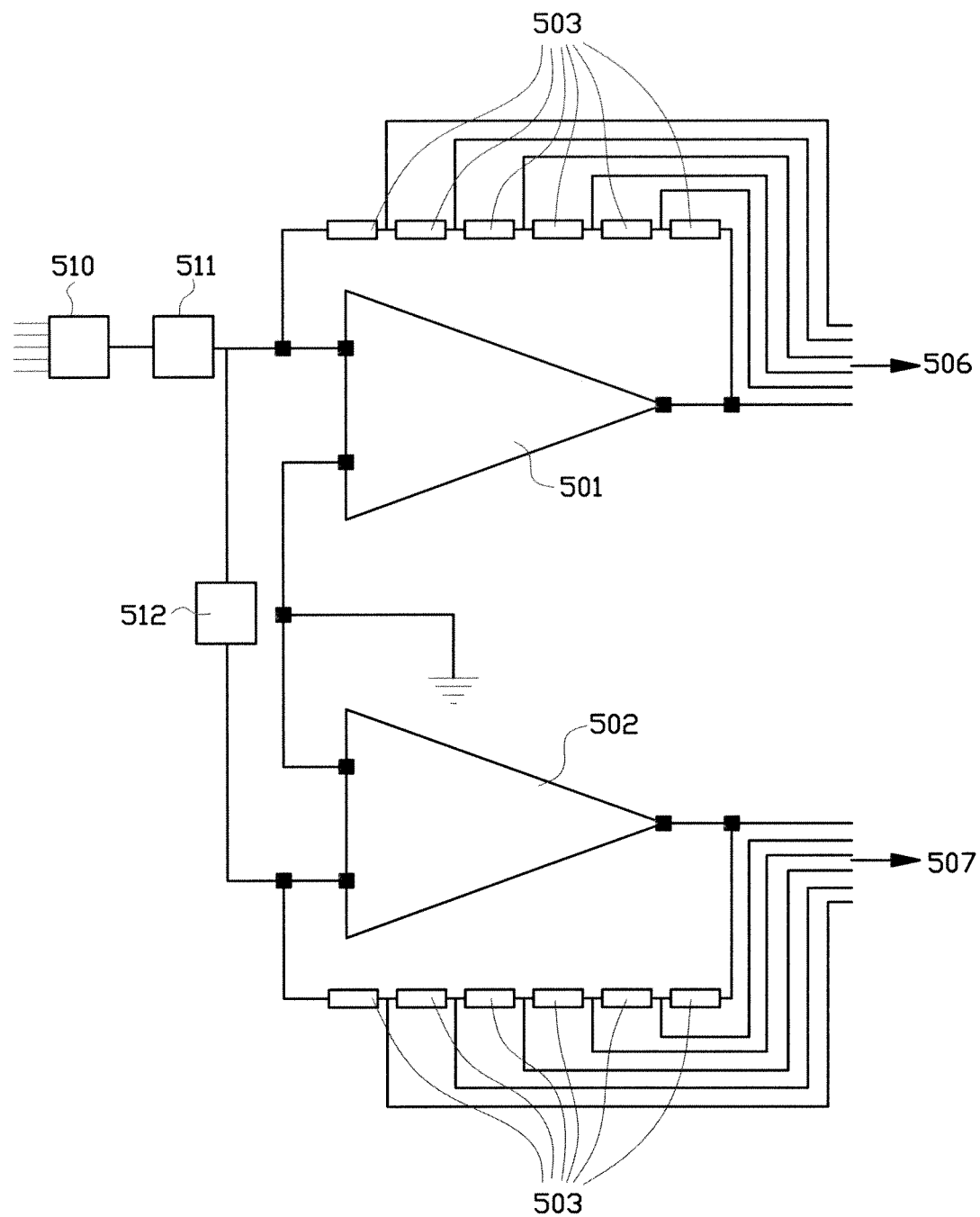
FIG. 5B shows a schematical overview of a part of another electronic control circuit for use in a manipulator device according to the invention.

FIG. 5A and FIG. 5B show a schematical overview of two examples of an electronic control circuit for use in a manipulator device according to the invention. In FIG. 5A, the electronic control circuit comprises a first operational amplifier 501 and a second operational amplifier 502. Each operational amplifier may be grounded and may be connected to a DAC (digital-to-analogue) converter, indicated by 505 and 504 respectively. Each DAC converter may be controlled via a serial/parallel+ bus interface (SPI), indicated by 508 and 509 respectively.

The DAC converter 504 connected to the first operational amplifier 501 may provide a positive voltage Vmax and the DAC converter 505 connected to the second operational amplifier 502 may provide a negative voltage −Vmax. Both operational amplifiers may comprise resistors 503 as a feedback resistor. In that case, the amplified voltages Vmax and −Vmax may be divided into voltage parts. Each of these voltages (or voltage parts) may be fed to the electrodes 204 of a through opening 203 as indicated by arrows 506 and 507.

It may be understand that each voltage provided by the first or second operational amplifier may be fed to two electrodes among the electrodes 204. In this way, fewer resistors may be required in comparison with the example of FIG. 4. Furthermore, each voltage may also be fed to two electrodes of another through opening of the manipulation device. This would further reduce the number of resistors required.

In the embodiment of FIG. 5B, the two operational amplifiers 501 and 502 are connected to a single DAC converter 511. The first amplifier 501 is directly connected to the DAC converter 511 to receive a control signal from the DAC converter 511. The second operational amplifier 502 is connected to the DAC converter 511 via a polarity inverter 512 to receive the same control signal from the DAC converter 511 but with an inverted polarity. The DAC converter 511 may be controlled via a serial/parallel bus interface (SPI), indicated by 510.

It may be understood that the electronic control circuits of FIGS. 5A and 5B are relatively simple with few elements. Therefore, they can be easily integrated with the planar substrate of the manipulator device. At least a part of the circuitry of the FIGS. 5A and 5B, for example the operational amplifiers and the resistors, may be provided in the non-beam area 208 of the manipulator device.

FIG. 6A shows a schematical overview of a part of an embodiment 603 of a charged particle system according to the invention. The system may be provided with a first manipulator device 202 according to one of the embodiments described above and with a second manipulator device 601 also according to one of the embodiments described above.

The first manipulator device 202 may be arranged for deflecting one or more charged particle beams in an x-direction and the second manipulator device 601 may be arranged for deflecting one or more charged particle beams in a y-direction, wherein the x-direction is perpendicular to the y-direction. Both x-direction and y-direction may be perpendicular to the direction of the beam, indicated by arrow 607, which may be parallel with the optical axis of the optical column or parallel with the central axis of the through opening.

A first planar lens substrate 604 and a second planar lens substrate 605 may be arranged on opposite sides of the manipulator devices 202 and 601. Each planar lens substrate may comprise at least one planar lens aperture or an array of planar lens apertures, wherein the planar lens apertures are arranged in alignment with the through openings of the planar substrate of the manipulator(s).

The first planar lens substrate and the second planar lens substrate may form together with the manipulator device(s) a lens, e.g. an Einzel lens for focusing one or more beams. A voltage difference may be applied between the first planar lens substrate 604 and the first manipulator device 202, and another voltage difference may be applied between the second manipulator device 601 and the second planar lens substrate 605, in such way that a positive lens effect is generated. In this way, the manipulator device(s) is/are part of the lens or lens arrangement and a more compact device may be obtained.

In an embodiment, the first planar lens substrate 604 and the second planar lens substrate 605 are grounded while the manipulator device(s) are provided with an off-set voltage of, for example, −1 kilovolt.

A planar current limiter substrate 606 may be provided, which may comprising at least one current limiter aperture or an array of current limiter apertures, wherein the current limiter planar substrate is arranged above the first planar lens substrate, wherein the current limiter aperture is arranged in alignment with the through opening of the planar substrate of the manipulator(s).

Cooling tubes 608 (or a cooling system) for cooling one or more planar substrates may further be provided. The cooling system may comprise the cooling tubes 608 adjacent to the through openings and a pump for pumping a cooling fluid (such as water) through the cooling tubes.

A cooling tube 608 may be arranged between the first and the second manipulator device, preferably in a circle around the central axis of the through openings.

As can be seen in FIG. 6A, the cross-sectional area of beam 115 on the planar current limiter substrate 606 is larger than the respective current limiter aperture. Some of the charged particles in the beam 115 may therefore be absorbed by the planar current limiter substrate 606.

Using the above-mentioned positive lens, the remaining beam may be deflected. In FIG. 6A this is illustrated by a beam axis 620 that changes its direction. The beam 115 passes through the through openings of the manipulator device(s) without hitting or contacting the planar substrates thereof.

In an embodiment, the beam may be deflected in the x- and y-direction by first manipulator device 202 and the second manipulator device 601, during the exposure of the target.

Both manipulator devices 202 and 601 may be provided with respective cross-talk shield 602 and 609. The cross-talk shields may provide an electrical shielding of the circuits of the manipulator devices against any electro(magnetic) fields of any other circuitry in the vicinity.

Figure 6B:
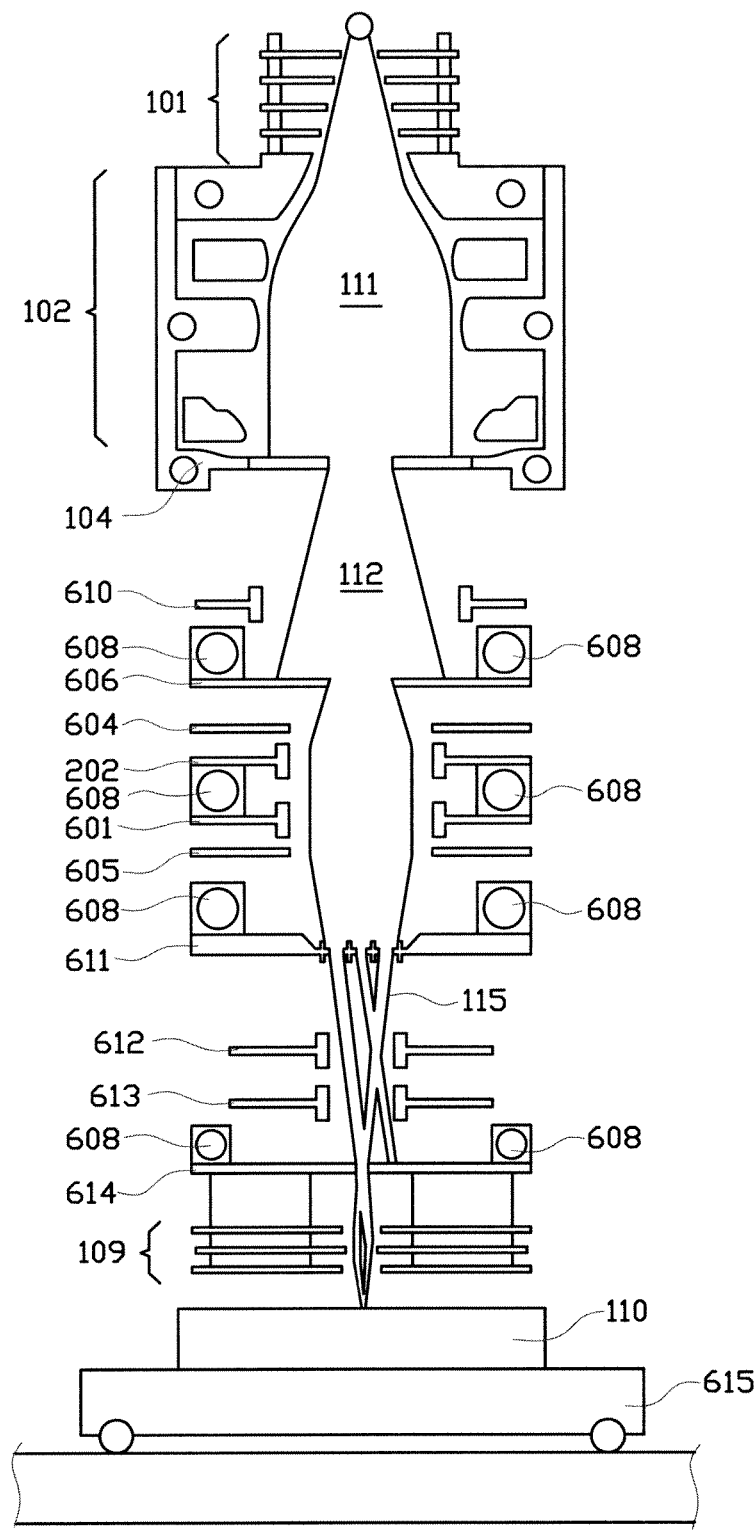
FIG. 6B shows a schematic overview of a part of another embodiment of a charged particle system according to the invention; and, FIG. 7 shows a schematic overview of a part of an embodiment of a through opening according to the invention.

FIG. 6B shows a schematic overview of a part of another embodiment of a charged particle system according to the invention. The system may comprise a charged particle source 101 and collimation means 102 for collimating the charged particle beam 111. The collimated beam 111 may impinge on an aperture array 104, which blocks part of the collimated beam 111 for creating a sub-beam 112.

A deflector 610 may be provided for deflecting the sub-beam 112. In an embodiment, the deflector 610 may also comprise a manipulator device according to the invention. As in the embodiment of FIG. 6A, in FIG. 6B, a planar current limiter substrate 606 is provided and a first planar lens substrate 604 and a second planar lens substrate 605 are arranged on opposite sides of the manipulator devices 202 and 601. Their working has been described with reference to FIG. 6A.

The manipulated sub-beam 112 may then pass through aperture 611, by which the beamlets 115 are generated. Two deflectors 612 and 613 may be provided for deflecting the beamlets (or a group of beamlets) in an x- and a y-direction respectively. Some beamlets may be deflected by blanking deflectors (not shown separately in FIG. 6B) such that they do not pass through the beam stop substrate 614.

The beamlets that do pass through the beam substrate 614 are focused or projected by projection lens system 109 on target 110. Target 110 may be wafer and may be placed on a moveable platform 615, which may be movable in the x- and y-direction with respect to the projection lens system 109.

The system of FIG. 6B may further be provided with cooling tubes (or a cooling system) for cooling one or more planar substrates. The cooling system may comprise the cooling tubes 608 and a pump for pumping a cooling fluid (such as water) through the tubes.

Figure 7:
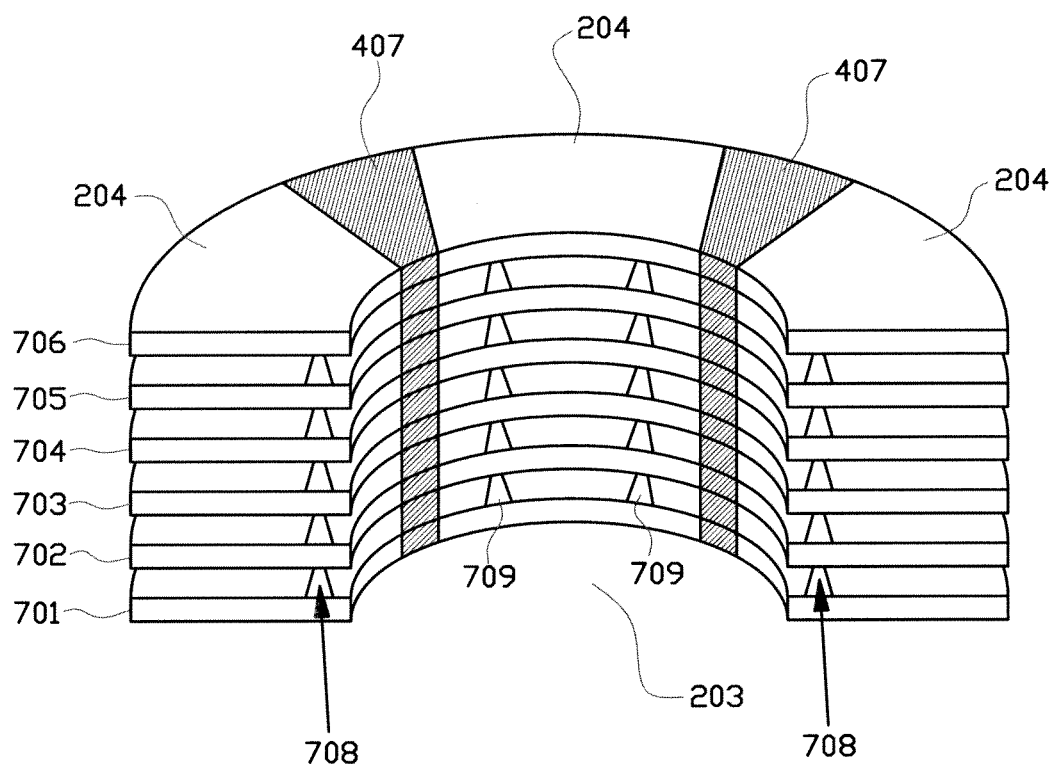

FIG. 7 shows a schematic overview of a part of an embodiment of a manipulator according to the invention. In FIG. 7 half of a through opening 203 is shown with only three electrodes 204 and only two gaps 407 for clarity reasons. The through opening may be provided with more electrodes as is described above.

The electrodes 204 may be produced as a chip and one or more metal layers may be used for supplying the voltages to the electrodes. In the example of FIG. 7, six metal layers 701, 702, 703, 704, 705, 706 are depicted. Between the metal layers, electrically insulating layers have been provided. Connections between the metal layers may be provided by one or more vias 708.

The electrodes may be provided partly in and on the planar substrate. Together with the metal layers the vias 708 may form pillars 709 that extend in the inner surface of through opening 203. In this way, the electrical field is not only generated in one plane, for example in the plane of metal layer 706, but in a larger portion of the through opening. The charged particles of the beam passing through will thus be affected longer (and thus more) by the electrical field when the charged particles pass through the through opening 203.

The electrodes 204 are preferably made from molybdenum, however they may also be made from other conducting materials. The electrodes 204 may be approximately 5 micrometers thick, and the electrodes may be made by anisotropic etching of the molybdenum using reactive ion etching.

The electrodes 204 arranged in a first set of multiple first electrodes and in a second set of multiple second electrodes and the electronic control circuit may form a single CMOS device.

According to an aspect of the invention a charged particle system, such as a multi beam lithography system, is provided, comprising:

a first manipulator device 202 arranged for deflecting one or more charged particle beams 112 in an x-direction, the first manipulator device comprising a planar substrate 202 comprising at least one through opening 203 in the plane of the planar substrate 202, wherein each through opening 203 is arranged for passing at least one charged particle beam 112 there through; and, a second manipulator device 601 arranged for deflecting said one or more charged particle beams 112 in an y-direction, wherein the x-direction is perpendicular to the y-direction, the second manipulator device comprising a planar substrate 202 comprising at least one through opening 203 in the plane of the planar substrate 202, wherein each through opening 203 is arranged for passing at least one charged particle beam there through, wherein the second manipulator 601 device is arranged parallel with and adjacent to the first manipulator device 202 and the at least one through opening of the second manipulator device is arranged in alignment with the at least one through opening of the first manipulator device, In an embodiment, the system further comprises cooling tubes 608 arranged for transport a cooling fluid, wherein the cooling tubes 608 are arranged between the first and the second manipulator device.

Both the first and the second manipulator device may deform due to thermal expansion. When the cooling tubes are arranged between the first and the second manipulator device, the manipulator devices will expand symmetrically. This may prevent the manipulator devices from bending.

In an embodiment, the system further comprises an electronic control circuit arranged for providing different voltages to at least two first electrodes of the first set of multiple first electrodes.

In an embodiment, the first and the second manipulator device each form a single CMOS device.

It may be understood that the embodiments of a manipulator, of the first and/or second manipulator and/or the electronic control circuit as described above are also applicable to this charged particle system.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

In summary, the invention relates to a charged particle system such as a multi beam lithography system, comprising a manipulator device for manipulation of one or more charged particle beams, wherein the manipulator device comprises at least one through opening in the plane of the planar substrate for passing at least one charged particle beam there through. Each through opening is provided with electrodes arranged in a first set of multiple first electrodes along a first part of a perimeter of said through opening and in a second set of multiple second electrodes along a second part of said perimeter. An electronic control circuit is arranged for providing voltage differences the electrodes in dependence of a position of the first and second electrode along the perimeter of the through opening.

The invention claimed is:

1. Charged particle system such as a multi beam lithography system, comprising a manipulator device for manipulation of one or more charged particle beams, wherein the manipulator device comprises:
a planar substrate comprising at least one through opening in the plane of the planar substrate, wherein each through opening is arranged for passing at least one charged particle beam there through and each through opening is provided with electrodes arranged in a first set of multiple first electrodes along a first part of a perimeter of said through opening and in a second set of multiple second electrodes along a second part of said perimeter; and,
an electronic control circuit arranged for providing voltage differences to pairs of electrodes, each pair being a first electrode from the first set and a second electrode from the second set, in dependence of a position of the first and second electrode along the perimeter of the through opening, to provide an electrical field that is substantially homogeneous across the through opening.

2. Charged particle system according to claim 1, wherein the electronic control circuit is arranged for providing said voltage differences to said pairs in dependence of a distance between a first electrode and a second electrode of the respective pair, wherein preferably said voltage differences are directly proportional to said distance.

3. Charged particle system according to claim 1 or claim 2, wherein a plane is defined between the first part of the perimeter and the second part of the perimeter, a line is defined between an electrode and a diametrically opposite other electrode and an angle alpha (α) is defined by said plane and line, herein the electronic control circuit is arranged for providing voltage differences to electrode and said other electrode in dependence of the angle alpha (α), wherein preferably said voltage differences are directly proportional to sin(α).

4. Charged particle system according to claim 1, wherein a plane is defined between the first part of the perimeter and the second part of the perimeter, a line is defined between a respective electrode and a centre of the through opening, and an angle beta (β) is defined by said plane and said line,
wherein the electronic control circuit is arranged for providing voltages to respective electrodes in dependence of the angle beta (β), wherein preferably said voltages are directly proportional to sin(β).

5. Charged particle system according to claim 1, wherein the electrodes are uniformly distributed along said perimeter.

6. Charged particle system according to claim 1, wherein a plane is defined between the first part of the perimeter and the second part of the perimeter and the electrodes are arranged substantially symmetrically with respect to said plane.

7. Charged particle system according to claim 1, wherein a plane is defined between the first part of the perimeter and the second part of the perimeter and the first electrode of said pair is located opposite to the second electrode of said pair with respect to the plane.

8. Charged particle system according to claim 6, wherein electrical field lines of said electrical field are arranged at least perpendicular with respect to said plane.

9. Charged particle system according to claim 6 or claim 7, wherein said plane comprises a central axis of said through opening.

10. Charged particle system according to claim 1, wherein the electronic control circuit is arranged for providing a positive voltage V to the first electrode and a negative voltage −V to the second electrode.

11. Charged particle system device according to claim 1, wherein the electronic control circuit is arranged for providing a positive voltage V to two first electrodes and a negative voltage −V to two second electrodes.

12. Charged particle system according to claim 1, wherein the manipulator device further comprises two electrodes arranged along the perimeter of the through opening and substantially on said plane, wherein the electronic control circuit is arranged for providing a same voltage to each of said two electrodes, said voltage preferably being a offset voltage and preferably substantially equal to 0 Volt.

13. Charged particle system according to claim 1, wherein the electronic control circuit comprises resistors arranged as a voltage divider for providing voltages to respective electrodes, preferably as a feedback resistor of an operational amplifier.

14. Charged particle system according to any claim 1, wherein the electronic control circuit comprises a first operational amplifier with a voltage divider as a feedback resistor for providing voltages to the first electrodes, and a second operational amplifier with a voltage divider as a feedback resistor for providing voltages to the second electrodes.

15. Charged particle system according to claim 14, wherein the electronic control circuit further comprises a digital-to-analogue converter for outputting a single control signal to the first and the second operational amplifier and a polarity inverter arranged for inverting a polarity of said control signal, wherein the first operational amplifier is directly connected to the digital-to-analogue converter to receive said control signal and the second operational amplifier is connected to the digital-to-analogue converter via said polarity inverter to receive an inverted control signal.

16. Charged particle system according to claim 1, wherein:
gaps are provided between adjacent electrodes along the perimeter;
the perimeter of said through opening consists of a first area covered by the electrodes and a second area covered by the gaps;
a electrode-to-gap ratio is defined by said first area divided by said second area; and,
the electrode-to-gap ratio is in the range of 5-15.

17. Charged particle system according to claim 1, wherein the manipulator device comprises a cross-talk shield, the cross-talk shield comprising a planar shield substrate comprising at least one through opening in the plane of the planer shield substrate, wherein the at least one through opening of the planer shield substrate is arranged in alignment with the at least one through opening of the planar substrate.

18. Charged particle system according to claim 17, wherein a distance between the planar substrate and the planar shield substrate is smaller than 10 micrometer, and a thickness of the shield planar substrate is about a diameter of the at least one through opening of the planar substrate.

19. Charged particle system according to claim 1, further comprising:
a first planar lens substrate comprising at least one first planar lens aperture, wherein the at least one first planar lens aperture is arranged in alignment with the at least one through opening of the planar substrate of the manipulator device and the first planar lens substrate is arranged above and parallel with the planar substrate of the manipulator device; and, a second planar lens substrate comprising at least one second planar lens aperture, wherein the at least one second planar lens aperture is arranged in alignment with the at least one through opening of the planar substrate of the manipulator device and the second planar lens substrate is arranged below and parallel with the planar substrate of the manipulator device, wherein the system is arranged for providing a voltage difference between the first planar lens substrate and the planar substrate of the manipulator device and between the planar substrate of the manipulator device and the second planar lens substrate for generating an Einzel lens for said beams.

20. Charged particle system according to claim 19, wherein the first and second planar lens substrate are grounded and the system is arranged for providing a negative voltage to the planar substrate of the manipulator device(s), wherein said negative voltage is in the range of −1500 Volt to −500 Volt.

21. Charged particle system according to claim 1, further comprising a planar current limiter substrate, comprising at least one current limiter aperture, wherein the current limiter planar substrate is arranged above the planar substrate of the manipulator device and the at least one current limiter aperture is arranged in alignment with the at least one through opening of the planar substrate of the manipulator device.

22. Charged particle system according to claim 21, wherein the at least one current limiter aperture is smaller than the at least one through opening of the planar substrate of the manipulator device.

23. Charged particle system according to claim 1, wherein:
said manipulator device is a first manipulator device arranged for deflecting the one or more charged particle beams in an x-direction;
the charged particle system further comprises a second manipulator device arranged for deflecting said one or more charged particle beams in an y-direction, wherein the x-direction is perpendicular to the y-direction, wherein the second manipulator device is arranged parallel with and adjacent to the first manipulator device and the at least one through opening of the second manipulator device is arranged in alignment with the at least one through opening of the first manipulator device,
wherein the system is arranged for providing a voltage difference between the first planar lens substrate and the planar substrate of the first manipulator device and between the planar substrate of the second manipulator device and the second planar lens substrate for generating an Einzel lens for said beams.

24. Manipulator device for manipulating a charged particle beam in a charged particle system, such as a multi beam lithography system, according to claim 1.

25. Charged particle system according to claim 1, wherein the electrodes arranged in a first set of multiple first electrodes and in a second set of multiple second electrodes and the electronic control circuit form a single CMOS device.

26. Charged particle system according to claim 1, wherein said electrodes comprise at least 16 electrodes.

27. Charged particle system, such as a multi beam lithography system, comprising:
a manipulator device for manipulation of one or more charged particle beams, comprising a planar substrate comprising at least one through opening in the plane of the planar substrate, wherein each opening is arranged for passing at least one charged particle beam there through;

a first planar lens substrate comprising at least one first planar lens aperture, wherein the at least one first planar lens aperture is arranged in alignment with the at least one through opening of the planar substrate of the manipulator device and the first planar lens substrate is arranged above and parallel with the planar substrate of the manipulator device; and, a second planar lens substrate comprising at least one second planar lens aperture, wherein the at least one second planar lens aperture is arranged in alignment with the at least one through opening of the planar substrate of the manipulator device and the second planar lens substrate is arranged below and parallel with the planar substrate of the manipulator device, wherein the system comprises means for generating an Einzel lens for said beams, said means arranged for providing a voltage difference between the first planar lens substrate and the planar substrate of the manipulator device and between the planar substrate of the manipulator device and the second planar lens substrate.

28. Charged particle system according to claim 27, further comprising a planar current limiter substrate, comprising at least one current limiter aperture, wherein the current limiter planar substrate is arranged above the planar substrate of the manipulator device and the at least one current limiter aperture is arranged in alignment with the at least one through opening of the planar substrate of the manipulator device.

29. Charged particle system according to claim 28, wherein the at least one current limiter aperture is smaller than the at least one through opening of the planar substrate of the manipulator device.

30. Charged particle system according to claim 28, further comprising cooling tubes for transporting a cooling fluid, wherein said cooling tubes are arranged around the at least one current limiter aperture.

31. Charged particle system according to claim 28, wherein:
said manipulator device is a first manipulator device arranged for deflecting the one or more charged particle beams in an x-direction;
the charged particle system further comprises a second manipulator device arranged for deflecting said one or more charged particle beams in an y-direction, wherein the x-direction is perpendicular to the y-direction, the second manipulator device comprising a planar substrate comprising at least one through opening in the plane of the planar substrate, wherein each through opening is arranged for passing at least one charged particle beam there through, wherein the second manipulator device is arranged parallel with and adjacent to the first manipulator device and the at least one through opening of the second manipulator device is arranged in alignment with the at least one through opening of the first manipulator device,
wherein the system is arranged for providing a voltage difference between the first planar lens substrate and the planar substrate of the first manipulator device and between the planar substrate of the second manipulator device and the second planar lens substrate for generating an Einzel lens for said beams.

32. Charged particle system according to claim 31, further comprising cooling tubes for transporting a cooling fluid, wherein said cooling tubes are a ranged between the first and the second manipulator device.

33. Charged particle system according to claim 27, wherein the first and second planar lens substrate are grounded and the system is arranged for providing a negative voltage to the planar substrate of the manipulator device(s), wherein said negative voltage is in the range of −1500 Volt to −500 Volt.

34. Charged particle system such as a multi beam lithography system, comprising:
- a first manipulator device arranged for deflecting one or more charged particle beams in an x-direction, the first manipulator device comprising a planar substrate comprising at least one through opening in the plane of the planar substrate, wherein each through opening is arranged for passing at least one charged particle beam there through; and,
- a second manipulator device arranged for deflecting said one or more charged particle beams in an y-direction, wherein the x-direction is perpendicular to the y-direction, the second manipulator device comprising a planar substrate comprising at least one through opening in the plane of the planar substrate, wherein each through opening is arranged for passing at least one charged particle beam there through, wherein the second manipulator device is arranged parallel with and adjacent to the first manipulator device and the at least one through opening of the second manipulator device is arranged in alignment with the at least one through opening of the first manipulator device,
wherein the first and the second manipulator device each form a single CMOS device.

35. Charged particle system such as a multi beam lithography system, comprising:
- a first manipulator device arranged for deflecting one or more charged particle beams in an x-direction, the first manipulator device comprising a planar substrate comprising at least one through opening in the plane of the planar substrate, wherein each through opening is arranged for passing at least one charged particle beam there through;
- a second manipulator device arranged for deflecting said one or more charged particle beams in an y-direction, wherein the x-direction is perpendicular to the y-direction, the second manipulator device comprising a planar substrate comprising at least one through opening in the plane of the planar substrate, wherein each through opening is arranged for passing at least one charged particle beam there through, wherein the second manipulator device is arranged parallel with and adjacent to the first manipulator device and the at least one through opening of the second manipulator device is arranged in alignment with the at least one through opening of the first manipulator device; and,
- cooling tubes arranged for transport a cooling fluid, wherein the cooling tubes are arranged between the first and the second manipulator device.

36. Charged particle system such as a multi beam lithography system, comprising a manipulator device for manipulation of one or more charged particle beams, wherein the manipulator device comprises:
- a planar substrate comprising at least one through opening in the plane of the planar substrate, wherein each through opening is arranged for passing at least one charged particle beam there through and each through opening is provided with electrodes arranged in a first set of multiple first electrodes along a first part of a perimeter of said through opening and in a second set of multiple second electrodes along a second part of said perimeter; and,
- an electronic control circuit arranged for providing different voltages to at least two first electrodes of the first set of multiple first electrodes, in order to provide an electrical field that is substantially homogeneous across the through opening.

* * * * *

UNITED STATES PATENT AND TRADEMARK OFFICE
CERTIFICATE OF CORRECTION

| | | |
|---|---|---|
| PATENT NO. | : 8,618,496 B2 | Page 1 of 1 |
| APPLICATION NO. | : 13/458861 | |
| DATED | : December 31, 2013 | |
| INVENTOR(S) | : Marco Jan-Jaco Weiland et al. | |

It is certified that error appears in the above-identified patent and that said Letters Patent is hereby corrected as shown below:

On the Title Page, in Item [75], under Inventors, please delete "Alrik van den Brom" and insert --Alrik Johanan van den Brom--.

In the Claims

Column 19, Claim 3, line 38, please delete "herein" and insert --wherein--.

Column 20, Claim 14, line 22, please delete "any".

Column 20, Claim 17, line 52, please delete "planer" and insert --planar--.

Column 22, Claim 32, line 63, please delete "a ranged" and insert --arranged--.

Signed and Sealed this
First Day of April, 2014

Michelle K. Lee
*Deputy Director of the United States Patent and Trademark Office*